United States Patent
Wang

(10) Patent No.: US 7,696,822 B2
(45) Date of Patent: Apr. 13, 2010

(54) AMPLIFYING CIRCUIT AND ASSOCIATED LINEARITY IMPROVING METHOD

(75) Inventor: Po-Chih Wang, Kaohsiung (TW)

(73) Assignee: Realtek Semiconductor Corp., Hsinchu (TW)

(*) Notice: Subject to any disclaimer, the term of this patent is extended or adjusted under 35 U.S.C. 154(b) by 8 days.

(21) Appl. No.: 12/134,014

(22) Filed: Jun. 5, 2008

(65) Prior Publication Data
US 2008/0303591 A1    Dec. 11, 2008

(30) Foreign Application Priority Data
Jun. 6, 2007  (TW) .............................. 96120259 A

(51) Int. Cl.
*H03F 1/26* (2006.01)
(52) U.S. Cl. .................... 330/149; 330/302; 330/253
(58) Field of Classification Search .............. 330/149, 330/302, 253
See application file for complete search history.

(56) References Cited

U.S. PATENT DOCUMENTS

| | | | |
|---|---|---|---|
| 6,380,802 B1 * | 4/2002 | Pehike et al. ............. | 330/10 |
| 6,417,731 B1 * | 7/2002 | Funada et al. ............. | 330/149 |
| 6,975,848 B2 * | 12/2005 | Rawlins et al. ............. | 455/307 |
| 7,250,815 B2 * | 7/2007 | Taylor et al. ............. | 330/107 |
| 7,332,961 B2 * | 2/2008 | Blednov ............. | 330/149 |
| 7,408,408 B2 * | 8/2008 | Kang et al. ............. | 330/149 |

OTHER PUBLICATIONS

Saleh, A. A. M, and Cox, D.C. "Improving the power-added efficiency of FET amplifiers operating with varying-envelope signals", IEEE Trans On Microwave Theory and Techniques, vol. 31, No. 1 Jan. 1983, pp. 51-56.

* cited by examiner

*Primary Examiner*—Patricia Nguyen
(74) *Attorney, Agent, or Firm*—Thomas, Kayden, Horstemeyer & Risley

(57) ABSTRACT

An amplifying circuit and an associated linearity improving method are provided to correct the AM to PM distortion of an amplifier, thereby improving the amplifier linearity. The amplifying circuit includes an amplifier and a correcting unit. The amplifier has a non-linear input capacitor. The correcting unit generates a correction signal according to an input signal of the amplifier, and performs an AM to PM correction according to the correction signal, thereby making the amplifier have an approximately linear equivalent input capacitor.

21 Claims, 11 Drawing Sheets

AMPLIFYING CIRCUIT AND ASSOCIATED LINEARITY IMPROVING METHOD

BACKGROUND OF THE INVENTION (a). Field of the Invention

The invention relates to amplifying circuits, and more particularly to a linearity improved amplifying circuit and an associated linearity improving method.

(b). Description of the Prior Arts

In some circuits, high linearity amplifiers are needed. For example, in wireless communication systems such as 802.11a/b/g, the amplitude modulation (AM) needs high linearity power amplifiers to avoid signal distortion resulted from signal transmission. However, the amplifier such as the transistor amplifier usually has a non-linear input capacitor whose capacitance value varies with the input power of the amplifier. This would cause the AM to PM distortion of the amplifier to degrade the linearity of the amplifier.

SUMMARY OF THE INVENTION

It is therefore one objective of the invention to provide an amplifying circuit and an associated linearity improving method which can correct the AM to PM distortion of an amplifier to improve the linearity of the amplifier.

In one embodiment of the invention, an amplifying circuit is provided. The amplifying circuit comprises: an amplifier having an input capacitor; and a correcting unit, coupled to the amplifier, for generating a correction signal according to an input signal of the amplifier, and performing an AM to PM correction according to the correction signal to improve the linearity of the input capacitor of the amplifier.

In another embodiment of the invention, a method for improving the linearity of an amplifier having a non-linear input capacitor is provided. The method comprises: generating a correction signal according to an input signal of the amplifier; and performing an AM to PM correction according to the correction signal to improve the linearity of the input capacitor of the amplifier.

DETAILED DESCRIPTION OF THE INVENTION

Figure 1:
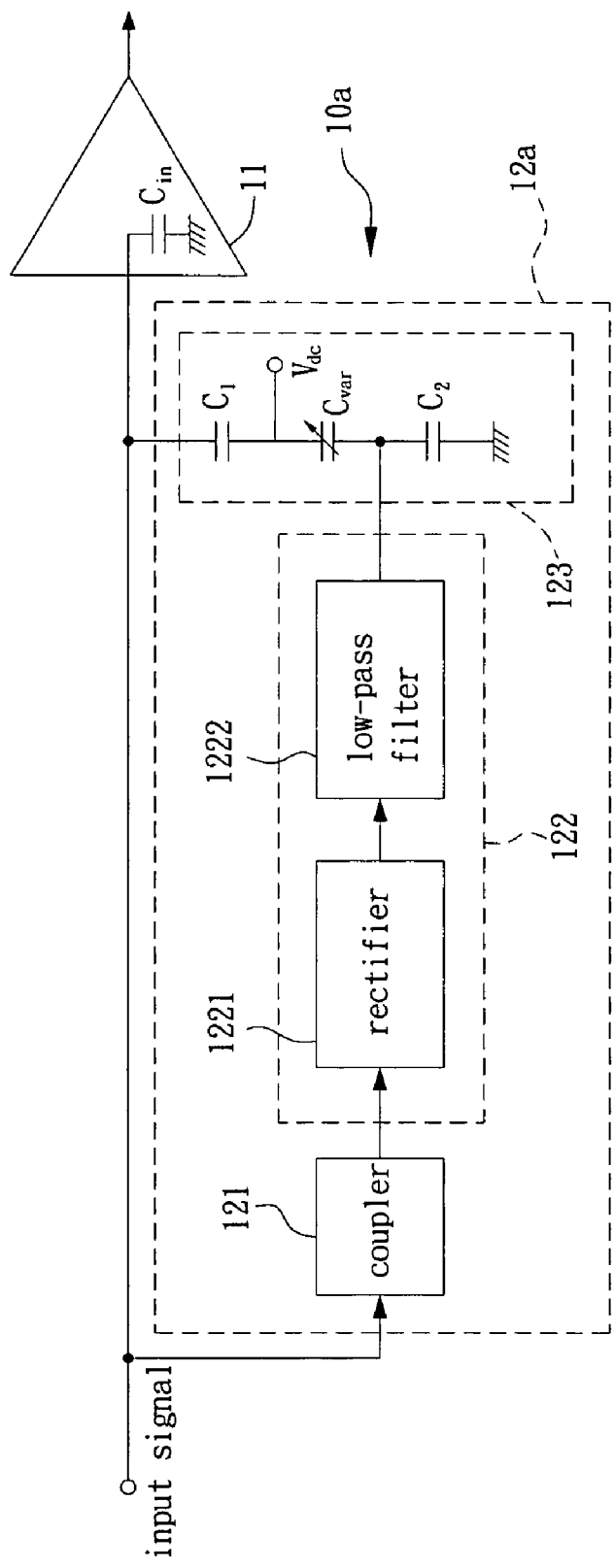
FIG. 1 is a block diagram of the first embodiment of the amplifying circuit according to the present invention.

FIG. 1 is a block diagram of the first embodiment of the amplifying circuit according to the present invention. As shown, the amplifying circuit 10a includes an amplifier 11 and a correcting unit 12a. The amplifier 11 can be a power amplifier. The amplifier 11 has a non-linear input capacitor $C_{in}$ whose capacitance value varies with the input power of the amplifier 11. The correcting unit 12a includes a coupler 121, an envelope detector 122 and a capacitor unit 123. The coupler 121 couples an input signal to the envelope detector 122, which then generates an envelope signal according to the coupled input signal. The envelope signal is used as a correction signal and provided to the capacitor unit 123. The capacitor unit 123 includes capacitors $C_1$, $C_2$ and a variable capacitor $C_{var}$. $C_{var}$ is a voltage-controlled capacitor whose capacitance value varies with the voltage difference between its two ends. $V_{dc}$ is a DC voltage, thus $C_{var}$ can adjust its capacitance value according to the difference between the voltage value of the envelope signal and $V_{dc}$. Both $C_1$ and $C_2$ have large capacitance values. $C_1$ is used to separate the input signal and $V_{dc}$ to avoid interference, while $C_2$ is used for AC ground. Thus, the equivalent input capacitor of the amplifier 11 is the sum of $C_{in}$ and $C_{var}$.

Figure 2:
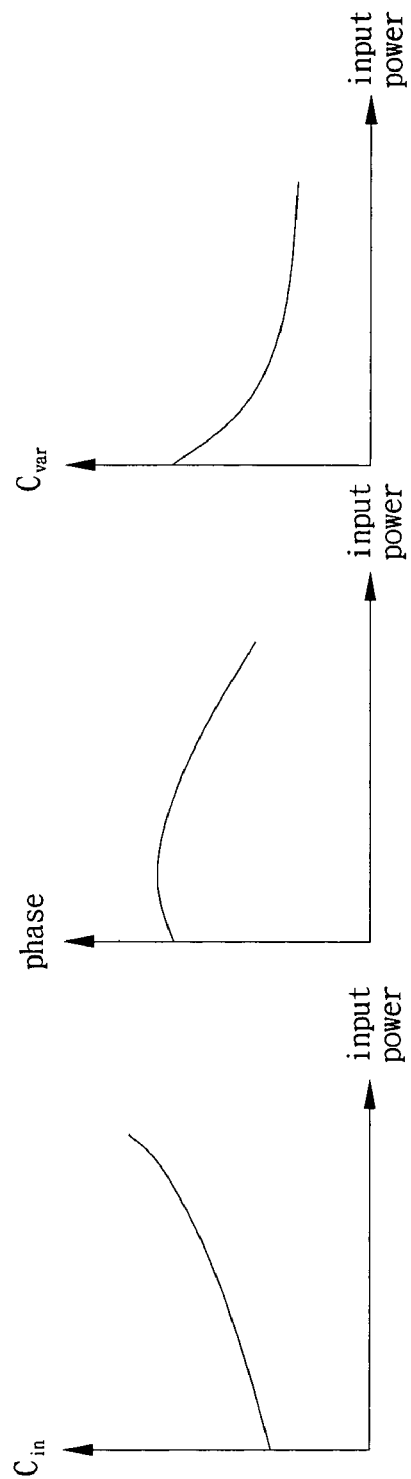
FIG. 2A shows the relationship between the input capacitor and the input power of the amplifier.
FIG. 2B shows the relationship between the phase of the input signal and the input power of the amplifier.
FIG. 2C shows the relationship between the variable capacitor and the input power of the amplifier.

When the amplifier 11 is a MOS transistor, the input capacitor (i.e. gate capacitor) of the amplifier 11 increases its capacitance value following the input power increases, as shown in FIG. 2A. Thus, the input end (i.e. gate) of the amplifier 11 has a larger phase lag as shown in FIG. 2B, and the AM to PM distortion occurs consequently. In FIG. 1, since the capacitance value of the voltage-controlled capacitor decreases with the increase of the voltage difference between its two ends, $C_{var}$ will decrease with the increase of the voltage value of the envelope signal, that is, $C_{var}$ will decrease with the increase of the input power, as shown in FIG. 2C. $C_{var}$ in FIG. 2C and $C_{in}$ in FIG. 2A are complementary to each other. Thus, when the capacitor unit 123 is parallel to the input capacitor of the amplifier 11, a stable and approximately linear equivalent input capacitor ($=C_{in}+C_{var}$) can be generated to correct the AM to PM distortion, thereby improving the linearity of the amplifier 11.

Please note that the amplifier 11 is not limited to the MOS transistor, and the capacitor unit 123 is not limited to the embodiment in FIG. 1. As long as the amplifier 11 has a non-linear input capacitor which varies with the input power, the architecture of FIG. 1 can be applied to implement the capacitor unit 123 which is complementary to the input capacitor, thereby generating an approximately linear equivalent input capacitor to correct the AM to PM distortion.

In one embodiment, the envelope detector 122 includes a rectifier 1221 and a low-pass filter 1222. The rectifier 1221 rectifies the input signal coupled from the coupler 121 and outputs a rectified signal. The low-pass filter 122 performs low-pass filtering on the rectified signal to generate the envelope signal. In this invention, the manner of generating the envelope signal is not limited to the envelope detector 122 of FIG. 1. The circuit embodiments of other manners of generating the envelope signal can also be applied to this invention, and thus will be in the scope of this invention.

Figure 3:
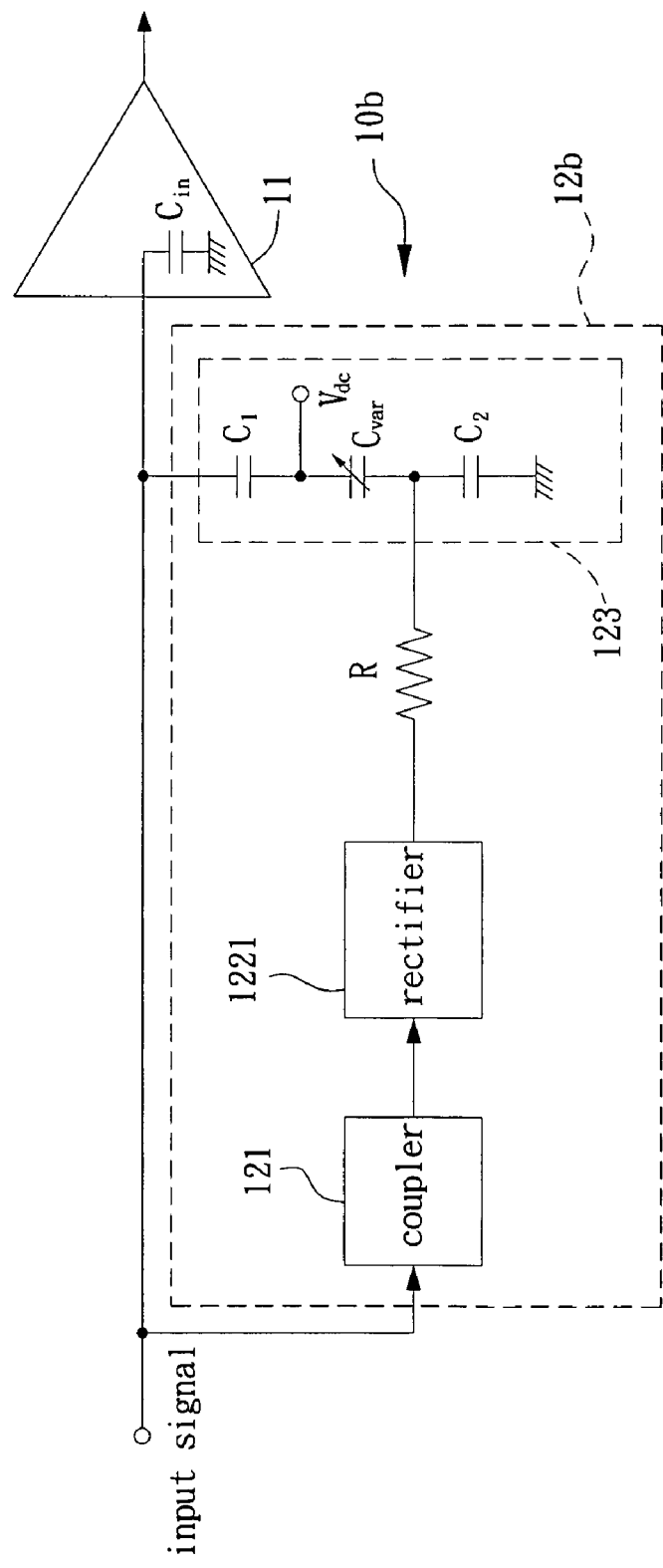
FIG. 3 is a block diagram of the second embodiment of the amplifying circuit according to the present invention.

FIG. 3 is a block diagram of the second embodiment of the amplifying circuit according to the invention. Compared with FIG. 1, please note the implementation of the low-pass filter in FIG. 3. In the amplifying circuit 10b, the low-pass filter in the correcting unit 12b is formed by a resistor R and the variable capacitor $C_{var}$ of the capacitor unit 123, so as to use less circuit components.

Figure 4A:
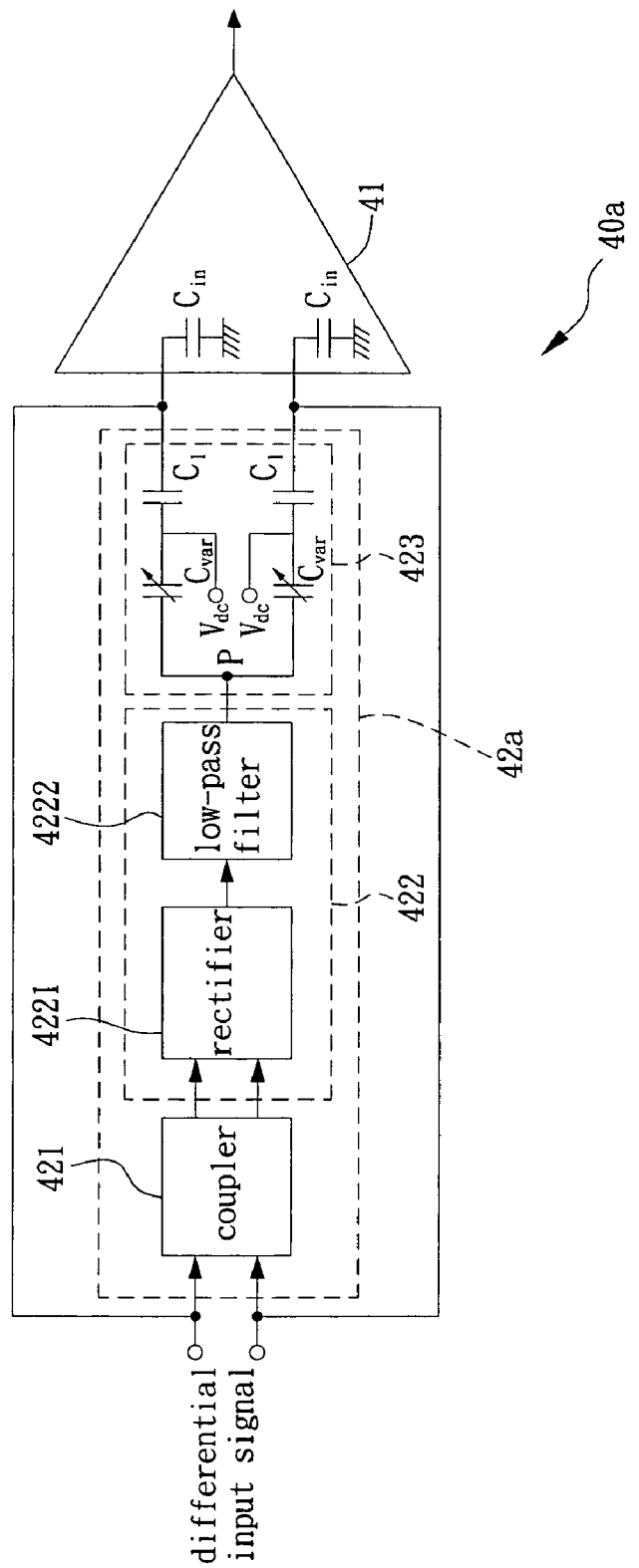
FIG. 4A is a block diagram of the third embodiment of the amplifying circuit according to the present invention.

The architecture of FIG. 1 can be applied to the case of using a differential signal as the input signal of the amplifying circuit. FIG. 4A is a block diagram of the third embodiment of the amplifying circuit according to the present invention. In FIG. 4A, the amplifying circuit 40a includes a differential amplifier 41 and a correcting unit 42a. Each of two input ends of the differential amplifier 41 has a non-linear input capacitor $C_{in}$ whose capacitance value varies with the input power of the differential amplifier 41. The correcting unit 42a includes a coupler 421, an envelope detector 422 and a capacitor unit 423. The coupler 421 couples a differential input signal to the envelope detector 422, which then generates an envelope signal according to the differential input signal. The envelope signal is used as a correcting signal and provided to the capacitor unit 423. The capacitor unit 423 contains two signal paths coupled to the two input ends of the differential amplifier 41 respectively. The capacitor on each signal path operates in a manner similar to the capacitor unit 123 in FIG. 1, while each signal path doesn't need to couple to a large capacitor for AC ground since the point P is equivalent to AC ground. Therefore, the equivalent input capacitor for each input end of the differential amplifier 41 is the sum of $C_{in}$ and $C_{var}$.

Figure 4B:
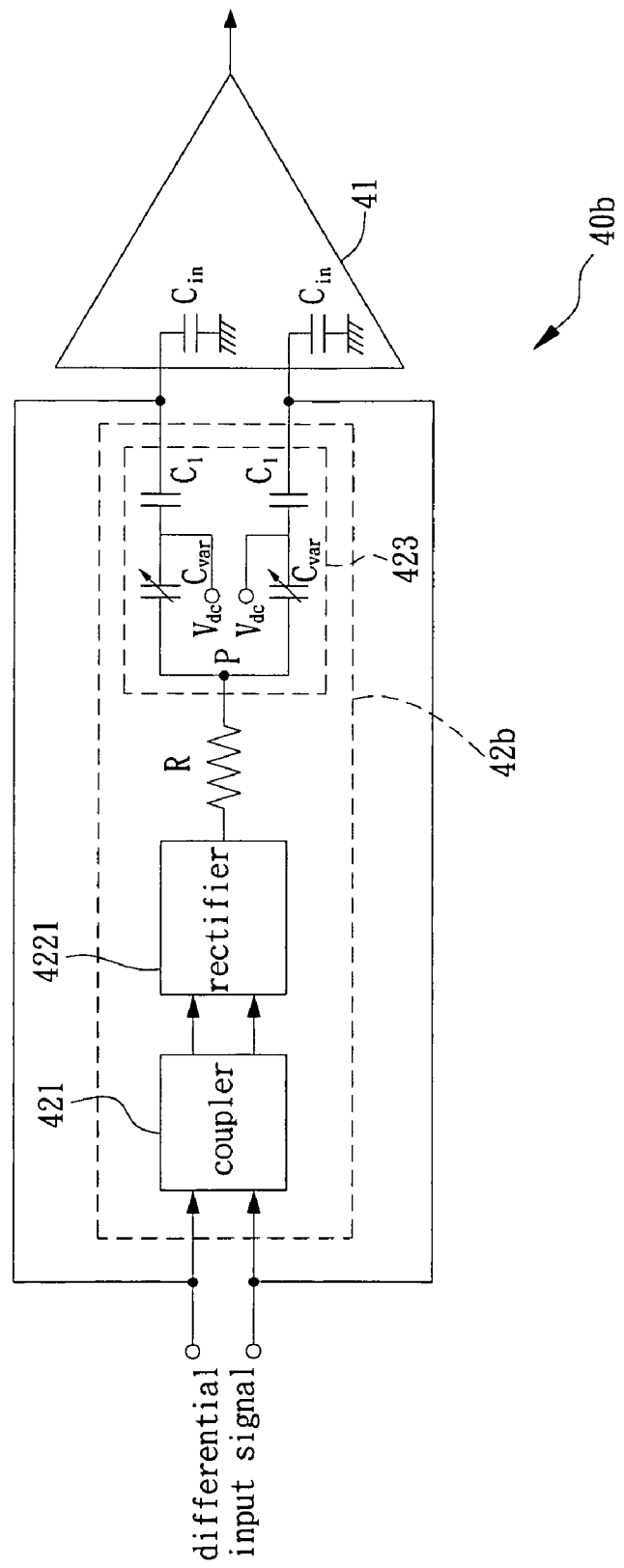
FIG. 4B is a block diagram of the fourth embodiment of the amplifying circuit according to the present invention.

FIG. 4B is a block diagram of the fourth embodiment of the amplifying circuit according to the present invention. Compared with FIG. 4A, please note the implementation of the low-pass filter in FIG. 4B. In the amplifying circuit 40b, the low-pass filter in the correcting unit 42b is formed by a resistor R and the variable capacitor $C_{var}$ of the capacitor unit 423, so as to use less circuit components.

Figure 5:
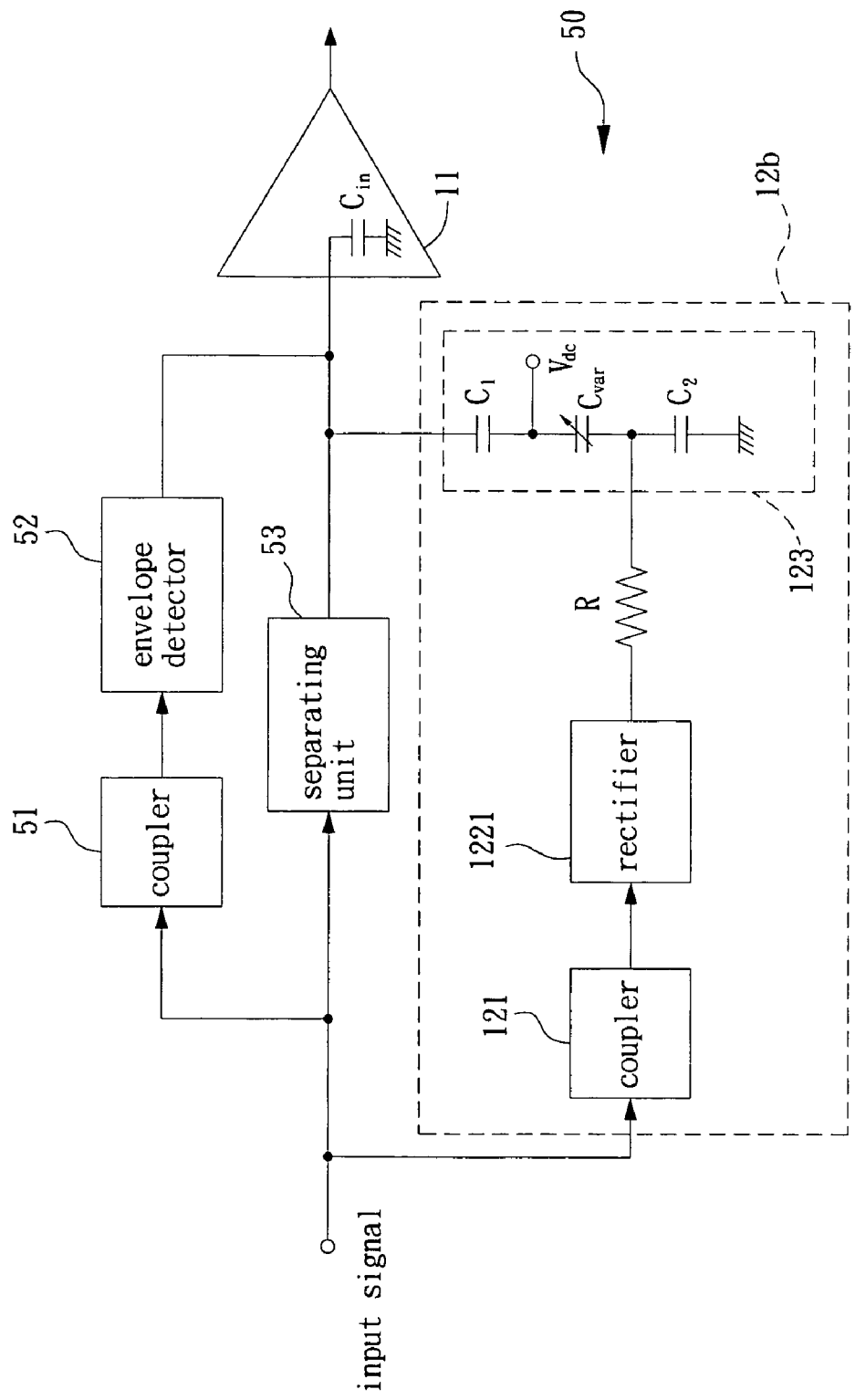
FIG. 5 is a block diagram of the fifth embodiment of the amplifying circuit according to the present invention.
Figure 6A:
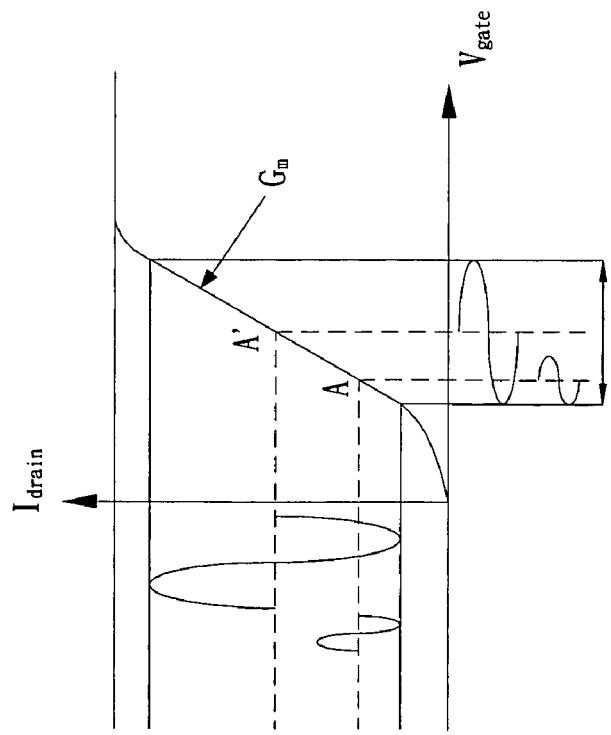
FIG. 6A shows the relationship between the drain current and the gate voltage of the MOS transistor.
Figure 6B:
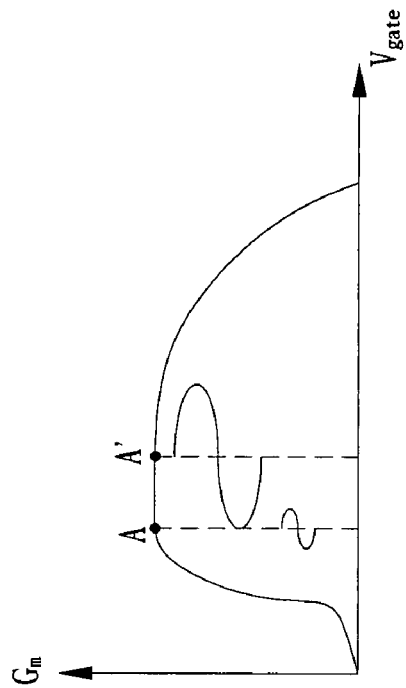
FIG. 6B shows the relationship between the transconductance and the gate voltage of the MOS transistor.

In FIGS. 1 and 3, the envelope signal can be used as the bias signal of the amplifier 11 so as to provide a dynamic bias. FIG. 5 is a block diagram of the fifth embodiment of the amplifying circuit according to the present invention, wherein the correcting unit 12b can be replaced by the correcting unit 12a in FIG. 1. In FIG. 5, the envelope signal is generated according to the input signal by the coupler 51 and the envelope detector 52, and is provided to the amplifier 11 for use as the bias. The separating unit 53 separates the envelope signal and the input signal to avoid interference. The use of dynamic bias does not influence the AM to AM linearity of the amplifier 11 on one hand, and can upgrade the power efficiency of the amplifier 11 on the other hand. For example, please refer to FIGS. 6A and 6B which show the case of the amplifier 11 as the MOS transistor. The envelope signal is directly provided to the gate of the MOS transistor for use as a bias signal. If the envelope signal (i.e. gate voltage $V_{gate}$) is small, then the bias current (i.e. drain current $I_{drain}$) is decreased to save power, shown as the A point in FIGS. 6A and 6B; if the envelope signal is large, then the bias current is increased to maintain good AM to AM linearity (i.e. the transconductance $G_m$ of the MOS transistor is kept stable), shown as the A' point in FIGS. 6A and 6B. As to the technique of dynamic bias for MOS transistors, please refer to Saleh, A. A. M, and D. C. Cox, "Improving the power-added efficiency of FET amplifiers operating with varying envelope signals," *IEEE Trans On Microwave Theory and Techniques*, Vol. 31, No. 1 January 1983, pp. 51-56.

As described, the embodiment of FIG. 5 can save power, maintain good AM to AM linearity, and correct the AM to PM distortion. Thus, the amplifier 11 has both good AM to AM and AM to PM linearity, and its power efficiency can also be upgraded.

Figure 7:
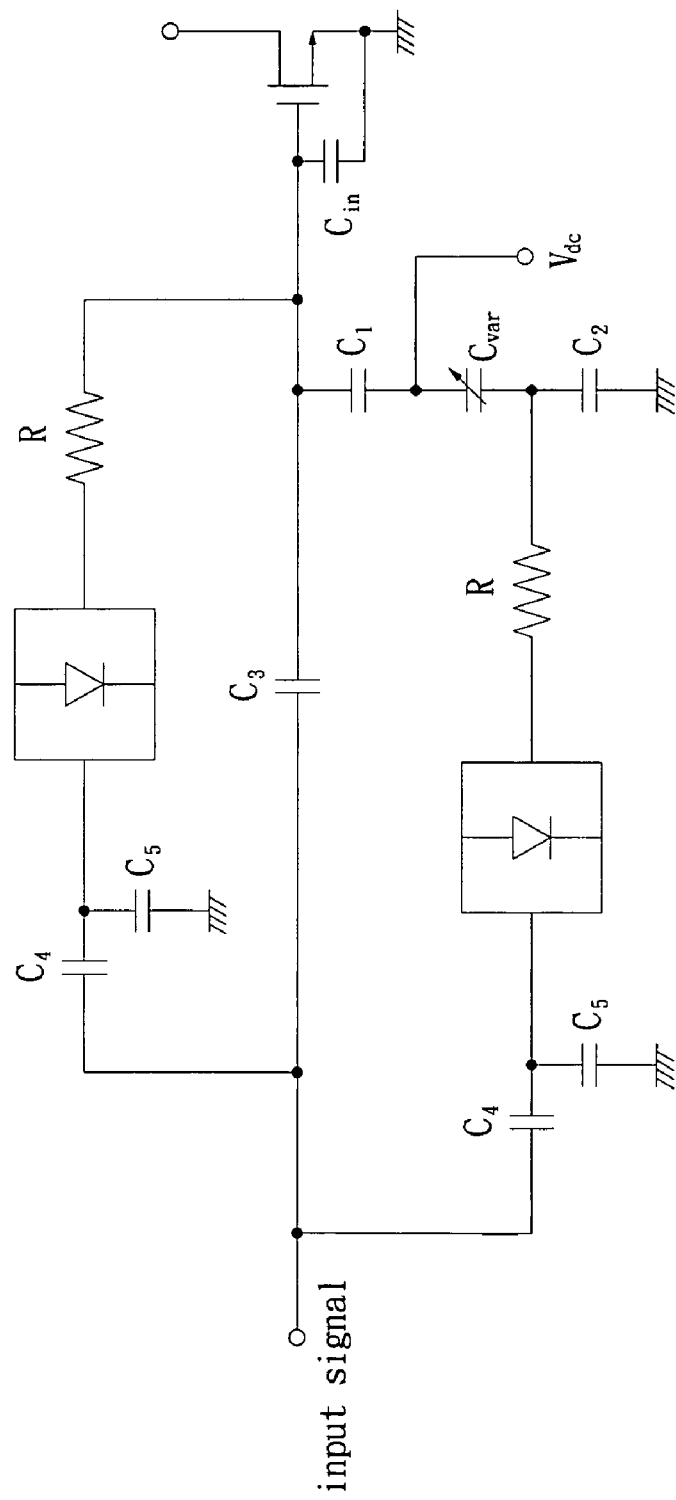
FIG. 7 is a diagram of a circuit embodiment of FIG. 5.

FIG. 7 shows a circuit embodiment of FIG. 5, wherein the amplifier 11 is a NMOS transistor; each of the couplers 12 and 51 is formed by capacitors $C_4$ and $C_5$; the envelope detector 52 includes a rectifier (composed of diodes) and a low-pass filter (composed of the resistor R and the input capacitor $C_{in}$ so as to use less components); the separating unit 53 includes a large capacitor $C_3$.

Figure 8:
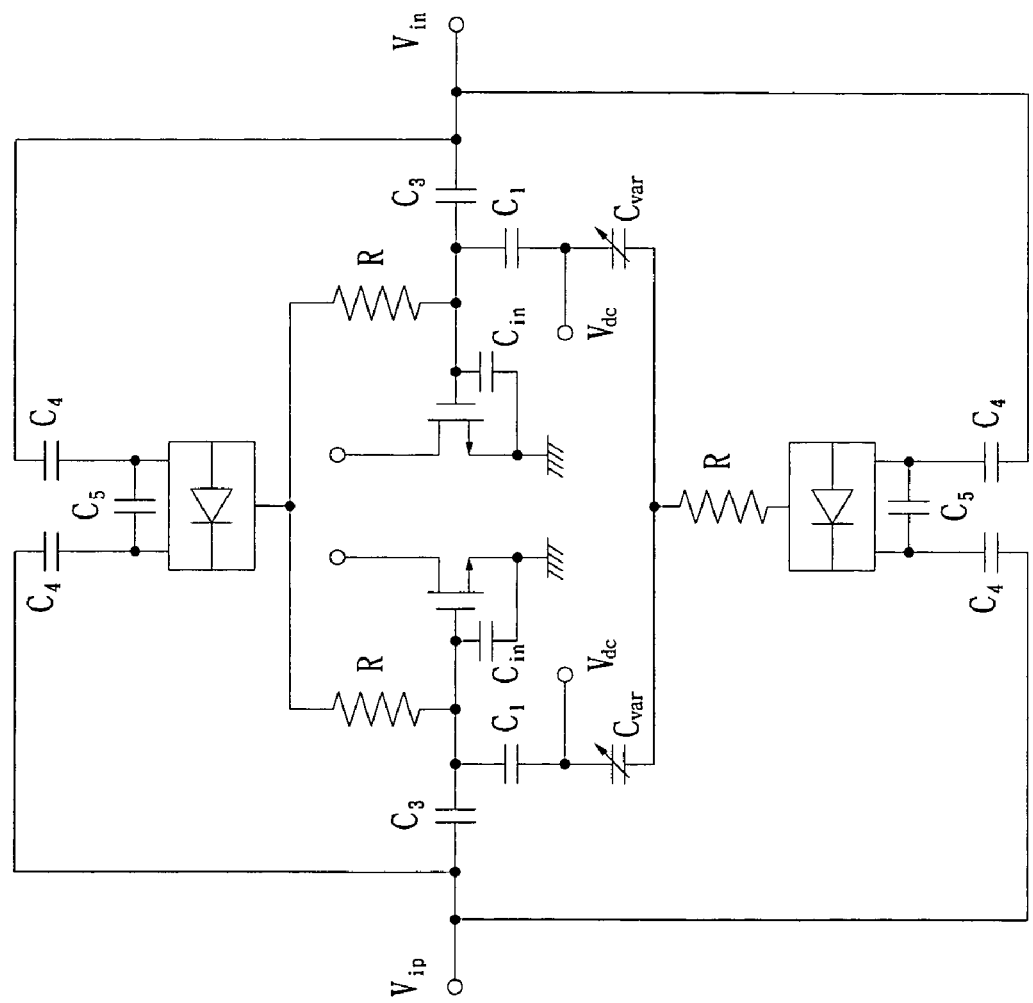
FIG. 8 is a diagram of the first embodiment showing that the circuit in FIG. 7 is extended to the case of using a differential signal as the input signal of the amplifying circuit.

FIG. 8 is a diagram of the first embodiment showing that the circuit in FIG. 7 is extended to the case of using a differential signal as the input signal of the amplifying circuit, wherein $V_{ip}$ and $V_{in}$ are the differential input signal.

Figure 9:
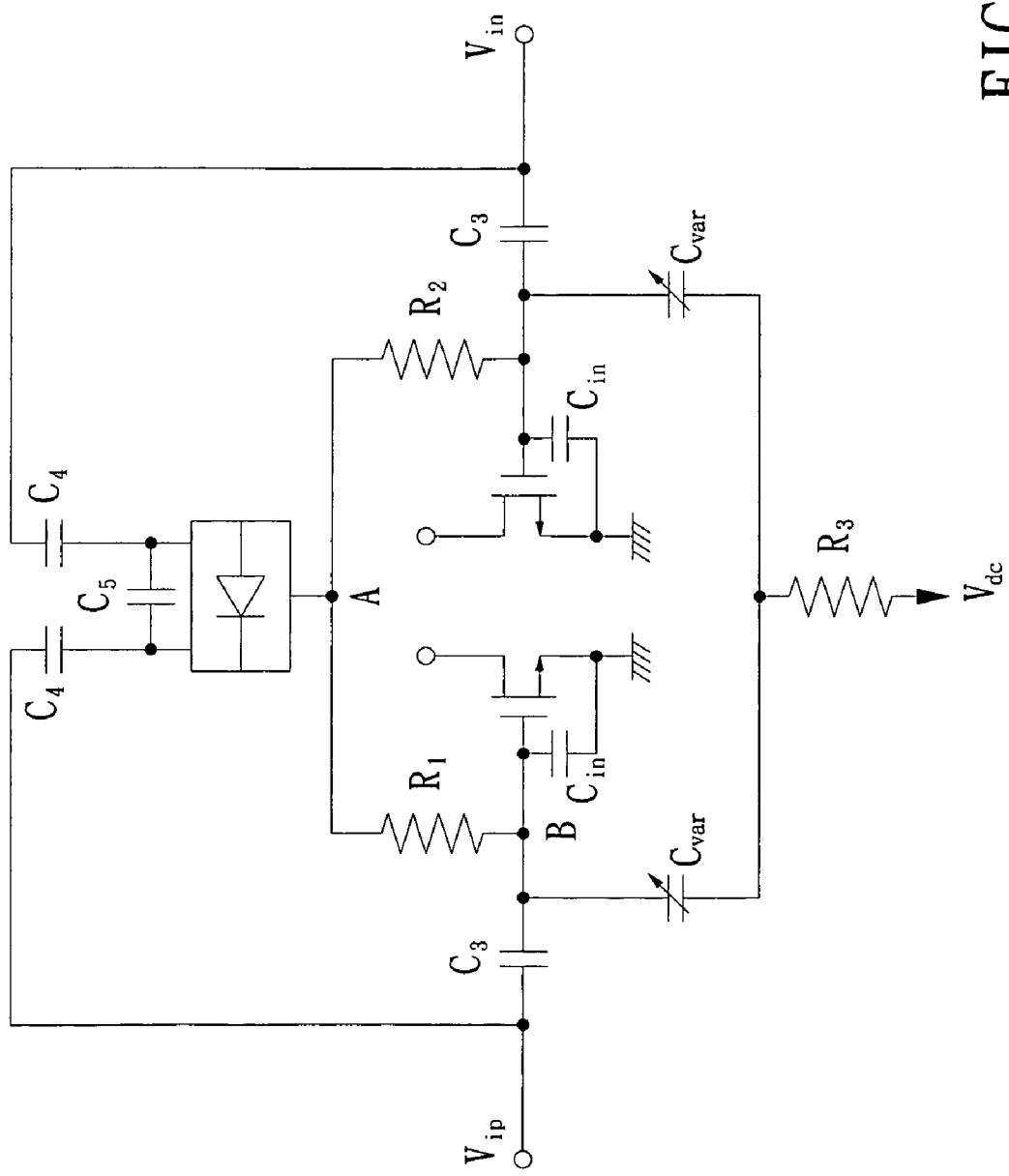
FIG. 9 is a diagram of the second embodiment showing that the circuit in FIG. 7 is extended to the case of using a differential signal as the input signal of the amplifying circuit.

FIG. 9 is a diagram of the second embodiment showing that the circuit in FIG. 7 is extended to the case of using a differential signal as the input signal of the amplifying circuit, wherein $V_{ip}$ and $V_{in}$ are the differential input signal.

Figure 10:
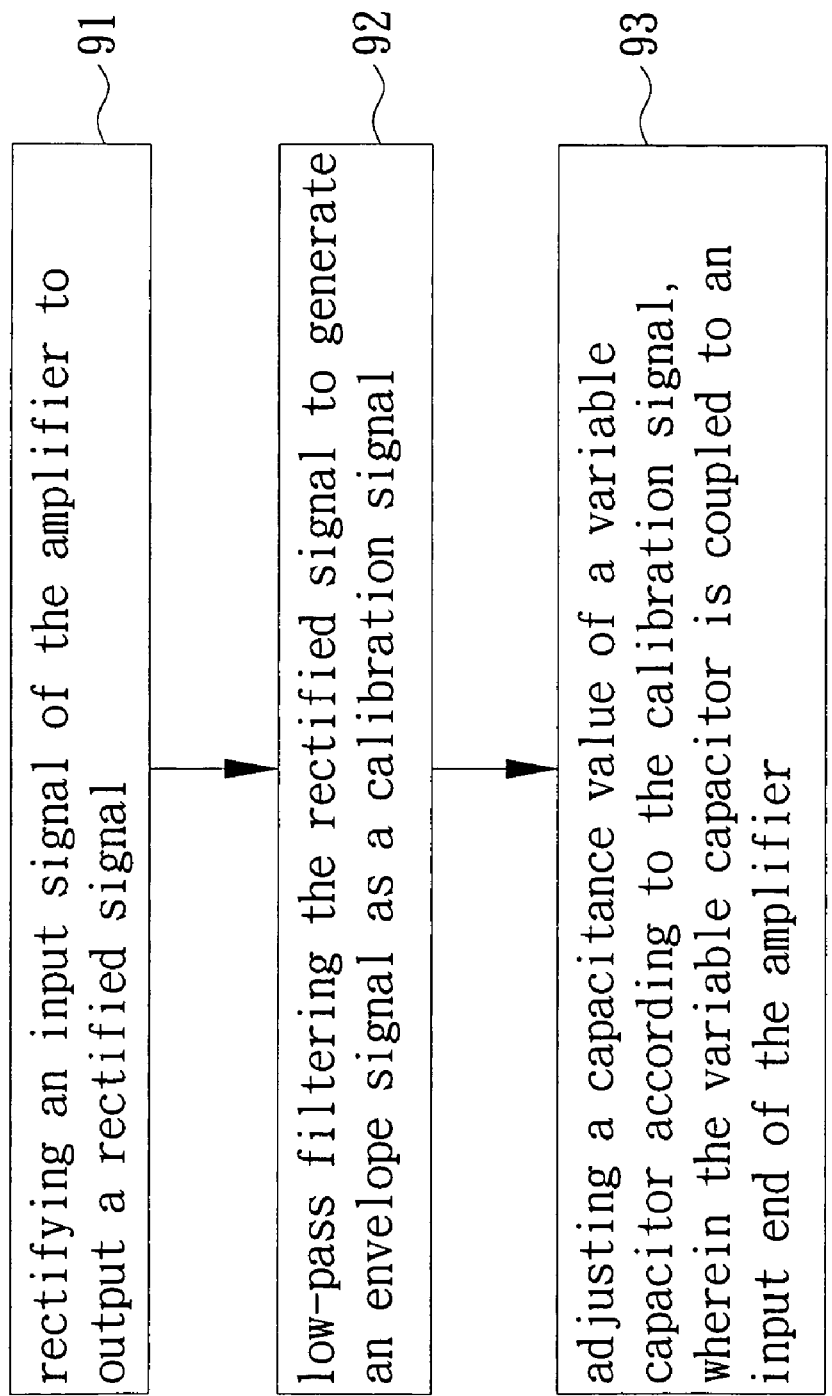
FIG. 10 is a flow chart of an embodiment of the method for improving the linearity of an amplifier according to the present invention.

FIG. 10 is a flow chart of an embodiment of the method for improving the linearity of an amplifier according to the present invention, wherein the amplifier has a non-linear input capacitor. Since the related steps of this embodiment have been described in detail as above, the description for these steps is omitted here.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. An amplifying circuit comprising:
   an amplifier having an input capacitor; and
   a correcting unit, coupled to the amplifier, for generating a correction signal according to an input signal of the amplifier, and performing an AM to PM correction according to the correction signal, wherein the correcting unit comprises:
   a capacitor unit coupled in parallel to the input capacitor, wherein the capacitor unit is configured to provide a capacitance value according to the correction signal to improve the linearity of the input capacitor of the amplifier.

2. The amplifying circuit of claim 1, wherein the correction signal is a voltage signal.

3. The amplifying circuit of claim 1, wherein the correcting unit comprises:
   an envelope detector for generating an envelope signal according to the input signal, wherein the envelope signal corresponds to the correction signal.

4. The amplifying circuit of claim 3, wherein the envelope signal is a bias signal of the amplifier.

5. The amplifying circuit of claim 3, wherein the envelope detector comprises:
   a rectifier for rectifying the input signal to output a rectified signal; and
   a low-pass filter for low-pass filtering the rectified signal to generate the envelope signal.

6. The amplifying circuit of claim 1, wherein the amplifier is a power amplifier.

7. The amplifying circuit of claim 1, wherein the amplifier is a transistor amplifier.

8. The amplifying circuit of claim 1, wherein the amplifier comprises a MOS transistor.

9. The amplifying circuit of claim 8, wherein the capacitor unit couples to a gate capacitor of the MOS transistor in parallel.

10. The amplifying circuit of claim 1, wherein the amplifier is a differential amplifier, and the input signal is a differential input signal.

11. A method for improving the linearity of an amplifier having an input capacitor, the method comprising:
generating a correction signal according to an input signal of the amplifier, wherein generating the correction signal comprises:
rectifying the input signal to output a rectified signal; and
low-pass filtering the rectified signal to generate an envelope signal,
wherein the envelope signal corresponds to the correction signal; and
performing an AM to PM correction according to the correction signal to improve the linearity of the input capacitor of the amplifier.

12. The method of claim 11, wherein the step of performing the AM to PM correction comprises:
adjusting a capacitance value of a variable capacitor according to the correction signal, wherein the variable capacitor is coupled to an input end of the amplifier.

13. The method of claim 12, wherein the correction signal is a voltage signal, and the variable capacitor is a voltage-controlled capacitor.

14. The method of claim 11, wherein the envelope signal is a bias signal of the amplifier.

15. The method of claim 11, wherein the amplifier is a power amplifier.

16. The method of claim 11, wherein the amplifier is a transistor amplifier.

17. The method of claim 16, wherein the amplifier comprises a MOS transistor.

18. The method of claim 17, wherein the variable capacitor couples to a gate capacitor of the MOS transistor in parallel.

19. The method of claim 11, wherein the amplifier is a differential amplifier, and the input signal is a differential input signal.

20. The amplifying circuit of claim 1, wherein the capacitor unit comprises:
a first capacitor for separating the input signal from DC voltages;
a second capacitor for providing an AC ground;
a third voltage-controlled capacitor for adjusting an equivalent input capacitance.

21. An amplifying circuit comprising:
an amplifier having an input capacitor; and
a correcting unit, coupled to the amplifier, for generating a correction signal according to an input signal of the amplifier to correct AM to PM distortion, the correcting unit comprising an envelope detector for generating an envelope signal according to the input signal corresponding to the correction signal, the envelope detector comprising:
a rectifier for rectifying the input signal to output a rectified signal; and
a low-pass filter for low-pass filtering the rectified signal to generate the envelope signal.

* * * * *